United States Patent [19]
Miller, Jr.

[11] Patent Number: 5,722,249
[45] Date of Patent: Mar. 3, 1998

[54] MULTI STAGE THERMOELECTRIC POWER GENERATION

[76] Inventor: Joel V. Miller, Jr., 14340 Trinidad, San Leandro, Calif. 94577

[21] Appl. No.: 653,862

[22] Filed: May 28, 1996

Related U.S. Application Data

[63] Continuation-in-part of Ser. No. 607,382, Feb. 27, 1996, which is a continuation of Ser. No. 491,787, Jun. 19, 1995, abandoned.

[51] Int. Cl.$^6$ .............................. F25B 27/00; F25B 21/02; F25D 15/00
[52] U.S. Cl. .............................. 62/238.2; 62/238.3; 62/3.7; 62/331; 62/476
[58] Field of Search ............................. 62/3.2, 3.7, 238.2, 62/238.3, 476, 490, 331; 136/204, 205

[56] References Cited

U.S. PATENT DOCUMENTS

| | | | |
|---|---|---|---|
| 3,625,279 | 12/1971 | Mayo | 165/62 |
| 4,276,446 | 6/1981 | Cannelli | 136/206 |
| 4,290,273 | 9/1981 | Meckler | 62/148 |
| 4,586,344 | 5/1986 | Lutz et al. | 62/101 |
| 5,001,904 | 3/1991 | Blomburg | 62/238.3 |

FOREIGN PATENT DOCUMENTS 844950 7/1981 U.S.S.R. ................ 62/238.2

*Primary Examiner*—William Doerrler
*Attorney, Agent, or Firm*—Robert Samuel Smith

[57] ABSTRACT

A refrigerating system having multiple stages wherein each stage has a boiler for holding a solution of a first constituent being a gas dissolved in a second constituent being a liquid. The boiler communicates with a separator where the gas is separated from the liquid by the heat from the boiler and the gas is then passed to a condenser where it condenses to a liquid. The liquid first constituent passes to an evaporator. In one of the stages, the evaporating first constituent cools the region to be refrigerated in thermal contact with the evaporated of the respective stage. The gaseous first constituent then passes to an absorber where it dissolves in the second liquid constituent that has passed from the separator to the absorber. The solution of first and second constituents now passes to the boiler where the cycle is repeated.

5 Claims, 5 Drawing Sheets

MULTI STAGE THERMOELECTRIC POWER GENERATION

CROSS REFERENCE TO OTHER APPLICATIONS

This application is a continuation in part of application Ser. No. 08/607,382 filed Feb. 27, 1996 pending, which is a continuation of application Ser. No. 08/491,787 filed Jun. 19, 1995 now abandoned from which priority is claimed.

FIELD OF THE INVENTION

This invention relates to a thermoelectric power generation system that employs an absorption refrigeration cycle to increase Carnot efficiency of converting heat from fuel to electricity.

BACKGROUND

The Peltier effect is a thermoelectric effect demonstrated by reference to FIG. 1 (prior art) showing a thermocouple of two dissimilar conductors, 10 and 12, joined at one junction 14 maintained at temperature T' by reservoir 18 and joined at a second junction 16 maintained at a lower temperature T" by reservoir 20. If conductor 10 is broken and a motor 22 is connected to the thermocouple, then an electric current I will flow through each conductor and a back EMF (E) across the motor terminals will be generated such that $$EI = \Pi'I - \Pi''I$$

EI is the work performed by the motor 22. $\Pi'I$ represents heat from reservoir 18 flowing into the thermocouple at the first junction 14 and $\Pi''I$ represents heat flowing into reservoir 20 out of junction 16. The "Peltier" coefficients $\Pi'$ and $\Pi''$ have values characteristic of the materials at temperatures T' and T" respectively. The Peltier coefficient of each junction is a function of temperature governed by:

$$\Pi/T = dE/dT$$

Factors which diminish the efficiency of the thermoelectric power generator of FIG. 1 include joule heating and the Thompson effect. The Thompson effect is the efflux or influx of heat in a conductor conducting an electric current simultaneously with the presence of a thermal gradient in the conductor. In the foregoing discussion, the Thompson effect has been neglected.

Another important factor that limits the efficiency of the thermoelectric power generator of FIG. 1 is the rate with which the reservoir 18 supplies heat to the junction 14 and the rate with which junction 16 supplies heat to reservoir 20. This rate can be limited, for example, by thermal conductivities of the media of reservoirs 18 and 20 which reduce the thermal gradient between junctions 14 and 16. Another consideration is that, while a large thermal gradient between the junctions generates a greater Peltier potential, it also results in increased heat being conducted through the junction and dissipated by the heat sink.

The net effect of factors leading to thermal losses is that, as the temperature difference across the thermoelement is increased, the advantage of increased thermopotential due to the increased difference of work functions is offset by a greater increase of thermal losses due to, for example, photon and phonon vibrations, etc.

According to the present state of the art, the most efficient thermoelectric materials are semiconductors such as lead telluride, silver gallium telluride, copper gallium telluride, silver indium Telluride, silver gallium telluride, copper gallium telluride, sodium manganese telluride. Compounds of Selenium, for example silver antimony Selenide and of sulfur, for example, the rare earth sulfides, exhibit strong thermoelectric properties. Compounds containing at least one member of the group selenium, sulfur and tellurium are known as chalcogenides. Small amounts of various agents (doping agents) such as indium or sodium may be incorporated in the thermoelectric compositions to establish the type of conductivity (p or n) of the material) The most commercially common pn materials used for electrical power generation are either Bismuth Telluride or Lead Telluride.

Those materials which are the primary materials used to generate electrical power according to the present state of the art, all have poor Carnot efficiencies, in converting fuel into electricity. The Carnot efficiency of present thermoelectric materials in commercial electrical generation systems as a whole never exceed 6%. (Some manufacturers claim 8–9 % for n type lead telluride but this claim is not a system claim but a claim for a single material standing alone.) because of the low Carnot efficiency, thermoelectric devices are not employed for generating electricity for utility purposes.

Thermoelectric generation of power using p n materials is generally employed only under conditions where reliability is a greater concern than energy efficiency. A typical commercial bismuth telluride electrical generator has a thermopile between a gas driven burner and a set of cooling fins exposed to ambient temperature. The temperature of gas (air) carrying exhaust heat emitted from a well designed commercial thermoelectric generator is ideally very near the temperature of the cooling fins. Nevertheless, the present state of the art generator is characterized by substantial loss of heat such that the efficiency is about 6%.

According to practices of the present art, heat generated by thermoelectric devices that was not used to generate thermoelectricity was either used directly for such purposes as to heat water or a room or was wastefully exhausted.

For example, some manufacturers of hot water heaters have placed a thermopile (generally thermal piles made of bismuth telluride) between a heat source (produced by a flame) and the water that is to be heated. This was an attempt to use all the heat to warm water that was not used to produce thermoelectricity.

The principle of the Carnot cycle which applies to the devices discussed above is to extract energy as heat, $Q_2$, from a source at a temperature $T_2$, apply a portion of the energy to performance of work, W, and discharge the remainder, $Q_1 = Q_2 - W$ at a lower temperature $T_1$. According to the well known Carnot principle, the maximum efficiency, $E = W/Q_2$ that can be achieved from a carnot engine operating between temperatures $T_1$ and $T_2$, is:

$$E_{max} = (T_2 - T_1)/T_2 \text{ (The Carnot efficiency)}$$

The objective in operating a refrigerator is to perform work to withdraw heat $Q_2'$ from a source at temperature $T_2'$ and to discharge the heat $Q_2'$ to a heat sink at temperature $T_1'$ where $T_1 \geq T_2$. This requires performing an amount of work W which is equivalent to an additional amount of heat discharged to the heat sink so that the total amount of work discharged to the heat sink is $Q_1'$ where:

$$Q_1 = Q_2 + W$$

A typical absorption refrigerator system circulates a solution containing two components which have different boiling points. A common solution for this type of refrigeration is ammonia dissolved in water. A gas flame heats the solution of ammoniated water to drive off gaseous ammonia. The ammonia gas is then cooled in a condenser to ambient temperature and condenses to a liquid. The heat of condensation is expelled to the ambient environment. The liquid ammonia is then discharged into an evaporator where it evaporates and therefore absorbs heat so as to produce a cooling effect. Hydrogen gas is present in the evaporator and mixes with the ammonia thereby ballasting the pressure throughout the system. The heavy ammonia vapor mixed with hydrogen is then conducted to an "absorber" where the ammonia is absorbed by incoming water and the hydrogen is expelled. The ammonia dissolving in the water generates heat and this heat of solution is allowed to dissipate from the absorber in order to maintain the temperature of the water ammonia solution at ambient temperature and ensure that the water is saturated with ammonia at room temperature. Then the ammonia-in-water solution circulates back to the location of the flame where ammonia is driven off by the heat of the flame and the cycle is repeated so that the cycle is repeated. For a more detailed description of the absorption refrigerator, the reader is referred to "Heat and Thermodynamics" by Zemansky published by McGraw Hill, New York, N.Y. 1943 pages 211-214 which is hereby incorporated as reference into this specification.

All of the generating and refrigerating devices of the present art described above discharge large amounts of waste heat.

THE INVENTION

SUMMARY

It is an object of this invention to provide an efficient electrical generation system by using refrigeration principles to direct heat flux through one or more thermoelectric devices that would otherwise be lost as heat exhaust in conventional devices.

In one embodiment, a first thermopile is positioned between the gas flame and the boiler unit of an absorption refrigerator so that part of the heat flux generated by the temperature gradient between the flame and the boiler is used to generate thermoelectric power in the first thermopile. The second thermopile has its high temperature side exposed to an air current that has been positioned to draw heat from the absorber and condenser, and its low temperature side cooled by positioning proximal to the evaporator.

In another embodiment, the invention comprises a unit that includes an absorber refrigerator and a one or more thermopiles where the units are ganged together in succession such that heat exhausted by one unit is passed onto a successive (lower stage) unit. Each stage is characterized as operating in a temperature range that is lower than the preceding stage and higher than the following stage. The thermopile of each unit has a "high temperature side" maintained at an elevated temperature by contact with the condenser of the absorption refrigerator and whose "low temperature side" is cooled by contact with the evaporator side of the same refrigerator. Each stage may have more than one unit and any stage may have fewer units than a next higher stage corresponding to a heat flow through the system that diminishes due to the generation of thermoelectric power as the heat flows from one stage to the next stage.

The efficiency of the system of units ganged together in stages resides ideally in the fact that the heat escaping from one stage is used to produce thermoelectricity in the following stage so that the heat expressed at the last stage is substantially reduced from the heat entering the first stage in contrast to devices of the present art. The system is amenable to using the presently known most efficient thermoelectric materials.

DESCRIPTION OF A PREFERRED EMBODIMENT

Figure 1:
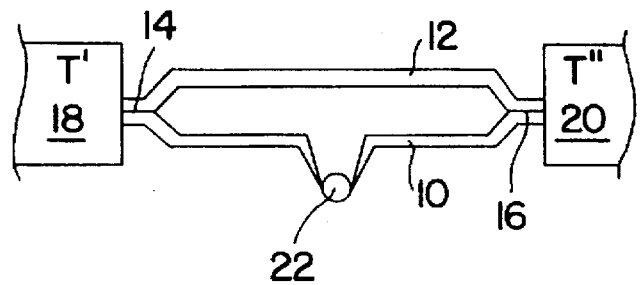
FIG. 1 illustrates the Peltier effect.

Turning now to a discussion of the drawings, FIG. 1 shows one embodiment of this invention for converting heat to thermoelectric power.

There is shown a boiler 11 for heating a solution of ammonia and water. The solution contained in the boiler 11 is forced up through line 17 to separator 13. In this embodiment, the boiler has a temperature of about 70° Celsius.

A first thermopile 21 is positioned such that the thermal high side is in thermal contact with the burner 24 and the thermal low side is the top side in thermal contact with the boiler 11. A thermopile containing bismuth telluride is preferred which produces 1.65 volts at 14 watts.

The heated solution then passes to separator 13 where ammonia vapor goes out line 30 to condenser 31, and water goes out conduit 34 joining conduit 35 back to absorber 36.

In absorber 36, ammonia mixed with hydrogen coming through line 33 from evaporator 27 recombines with water and the recombined water and ammonia go back on line 22 to boiler 11 while hydrogen escaping from the combined water and ammonia goes on line 35 to the evaporator 27.

Figure 2:
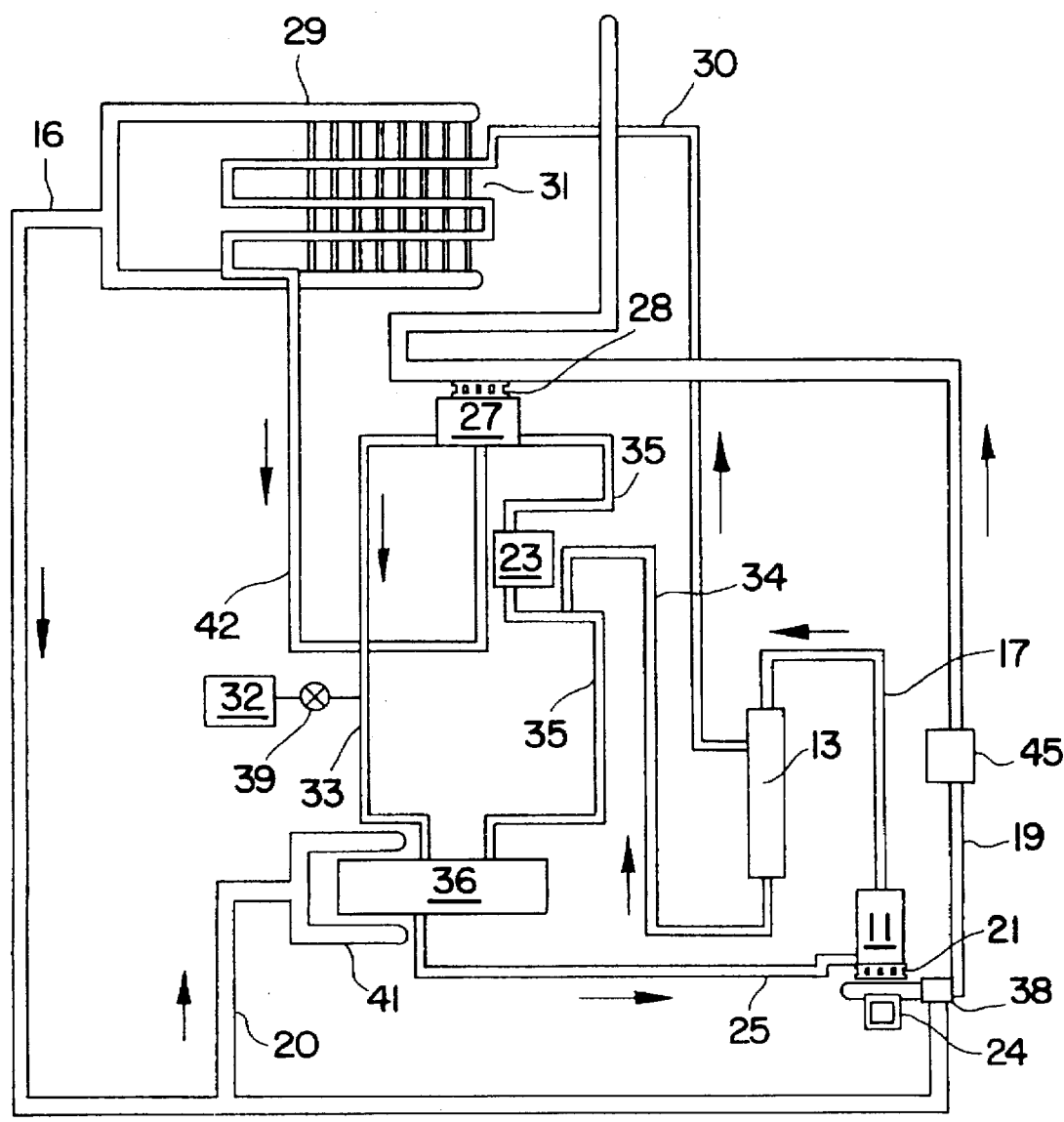
FIG. 2 shows one embodiment of the thermoelectric power generating system of the invention.

FIG. 2 shows a source of hydrogen 32 with a valve 39 for admitting a controlled amount of hydrogen into the conductor 33. FIG. 2 also shows a pump 23 (fan) for aiding circulation of hydrogen separated from the ammonia and water in the absorber 36 back to the evaporator 27.

In evaporator 27, liquid ammonia from the line 42 leading from condenser 31 vaporizes as it mixes with hydrogen gas returning from the absorption unit 36.

A second thermopile 28 is shown whose thermal high side absorbs heat from air circulating through line 19 that is used to cool condenser 31, then cools absorber 36 and finally passes in contact with boiler 11. The thermal low side of second thermopile 28 is conjuncts with the evaporator 27.

A cowling 29 is shown around condenser 31. The air through line 19 is heated when air fan 45 draws cooling air passing through cowling 29 and cowling 41 around absorber 36 then through a junction box 38 which draws hot air from burner 24. The junction box 38 can thus be used to shunt the incoming air from the condenser 31 and the absorption unit 36 first through the flame and then into the line 19 taking heat to the thermal high side of the second thermopile 28.

The invention combines the traditional thermoelectric material having a high thermoelectric potential but a low efficiency of power conversion with the refrigeration principle to produce a system having a second temperature potential or difference to drive a second thermopile made up of traditional thermoelectric materials.

The invention thereby invokes the refrigeration principal to apply heat discharged in establishing a temperature gradient across a first thermopile to drive a second thermopile. Example of embodiment 1:

The gas flame from burner 24 boils and agitates a solution of ammonia and water in boiler 11 so that a portion of the solution flows through the line 17 into separator 13. In so doing, more than 90% of the heat produced by the flame is conducted through the first thermopile 21 About 6% of the heat flux passing through thermopile 21c produces 14 watts of electricity at 1.65 volts. The ammonia in the evaporator 27 undergoes a liquid to vapor phase change and in so doing absorbs more than 315 calories of heat per gram. Water flows out from the separator 13 to the absorber 36 via line 34 connected to another line 35 that is the return path for the hydogen. The vaporized ammonia in the separator 13 goes through line 30 goes through line 30 leading to condenser 31 where the ammonia gives up more than 315 calories of heat per gram that the ammonia absorbed at boiler 11. The liquid ammonia continues in line 42 (an extension of line 30) to evaporator 27. Here the ammonia is subjected to negative pressure due to the absorber 36 recombining ammonia and water. Because of this, ammonia again absorbs more than 315 calories per gram in the transition form liquid to gas. This produces a cooling effect which draws heat through a second thermopile 28 that is receiving part of its heat from ambient air that has been prewarmed by heat from condenser 31 and heat transfer from exhaust gases from the burner 24 through an air moving system composed of cowling 41, air lines, 16 and 20 and a fan 5 (2-3 watts). The air moving system also draws heat from the absorption unit 36 that is drawn off by cowling 41 connected to air line 20. The vaporized ammonia then combines again with water in the absorber 36 via connecting line 13. The accompanying hydrogen leaves the absorber 36 via return line 15, the same return line 15 delivers water separated in separator 13.

The second thermopile 28 thus converts to electrical energy a portion of energy not converted to electrical energy by the first thermopile 21. Using current thermoelectric materials, the amount of electrical energy convened by each thermopile is below 8% of the total available energy whereas the amount of electrical energy converted by the combined thermopiles of the present invention is about 14%.

In the foregoing example, the ammonia-water solution of the system has been designed to boil at about 70° Celsius (ambient temperature) so that the condenser cooling fins of the ammonia and water absorption refrigerator has a temperature of 70° Celsius. The exhaust gas is emitted at a a temperature a few degrees over 70 degrees Celsius. The thermopile produces about 14 watts at 1.65 volts. The system also produces about 20 or more watts of cooling power. Because of the inefficiency of the burner, 20 or more watts of heat energy does not go through the thermopile. This energy is routed to the high temperature side of the second thermopile 28 while the cooling power is expressed on the low temperature side of the second thermopile 28, electrical output of the second thermopile is just over 10 watts. The effect of this is that using state of the art thermopiles that have a 6% Carnot efficiency for converting fuel into electricity can approach an overall system efficiency of up to 10% (or more) Carnot efficiency by adapting the refrigeration technique of this invention.

The invention retains the advantages characteristic of thermoelectric power generation of having no moving parts in the actual generation process. The fan is only an added feature which aids in moving the air and may be eliminated for a passive air moving system to move the warm air past the high temperature side of the second thermopile. Furthermore, non-induction motors that have long life expectancies and high reliability of thermoelectric generators can be employed where a fan will be more advantageous. The invention offers the traditional reliability of, thermoelectric generators that have no moving parts for applications at remote sites such as cathodic protection of pipe lines, power sources for communication devices and metering measuring devices. A further advantage of the invention is that it converts fuel much more efficiently than devices of the prior art.

Figure 3:
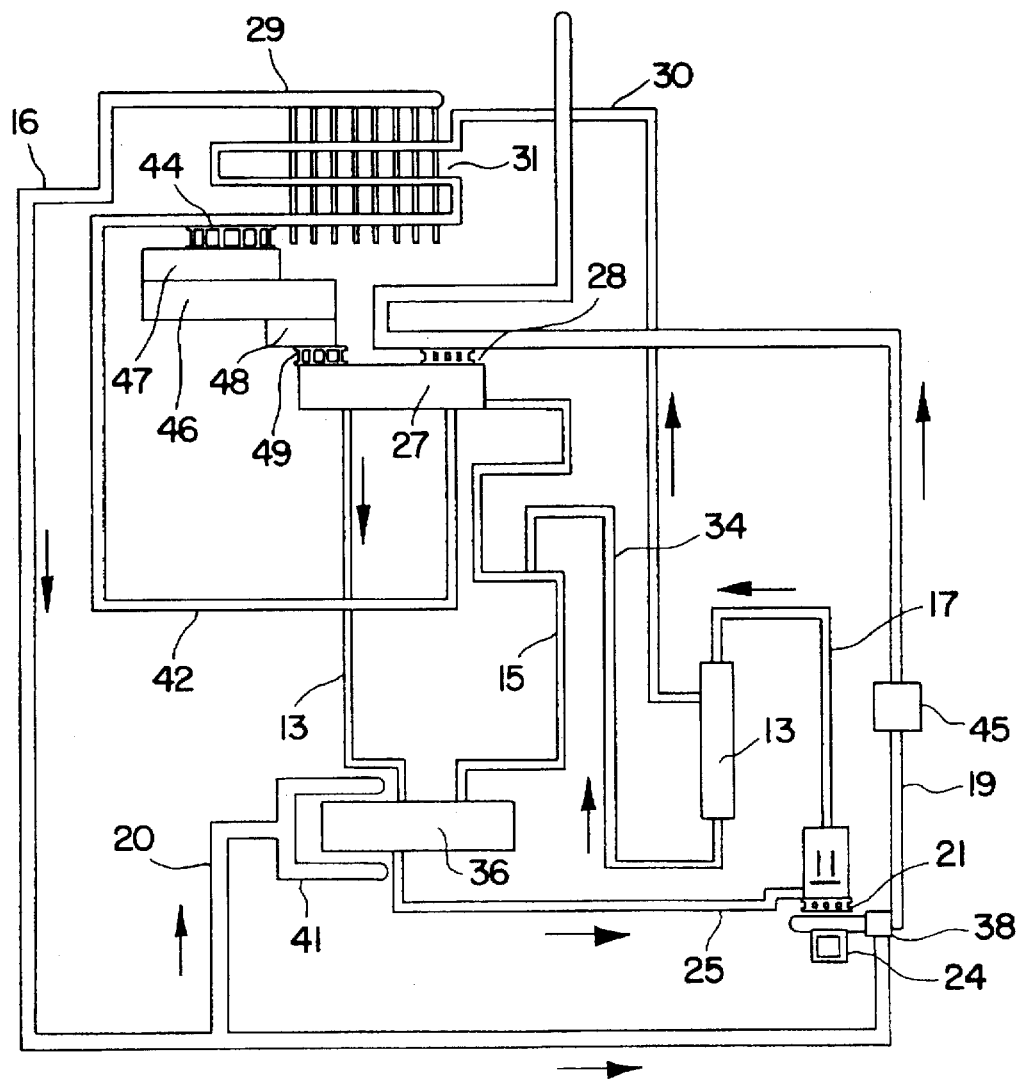
FIG. 3 shows another embodiment of the system with a circulating fan and an additional thermoelectric pile.

The foregoing description discloses a generator system having two thermopiles with one heat source to drive two thermoelectric piles. It is another embodiment of the invention that a third thermopile can be added as shown in FIG. 3. FIG. 3 shows the thermoelectric generator system of FIG. 2 with components indicated by numerals corresponding to FIG. 2. In addition, condenser 31 heats a third thermoelectric pile 44 which has its low side in heat conducting proximity to an evaporator 47 of a second adsorption refrigeration system 46 whose condenser 48 is joined in a thermal path through a fourth thermopile 49 to the evaporator 27 of the first system.

Additional thermoelectric piles and accompanying refrigeration systems can thus be cascaded together up to a practical limit depending on the temperature of the heat source.

Figure 4:
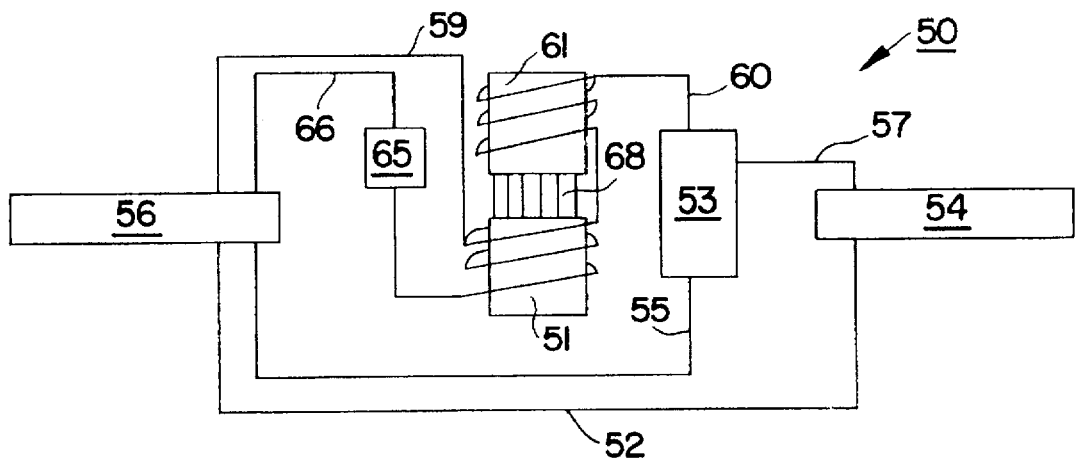
FIG. 4 shows a thermoelectric generator unit of the invention.
Figure 5:
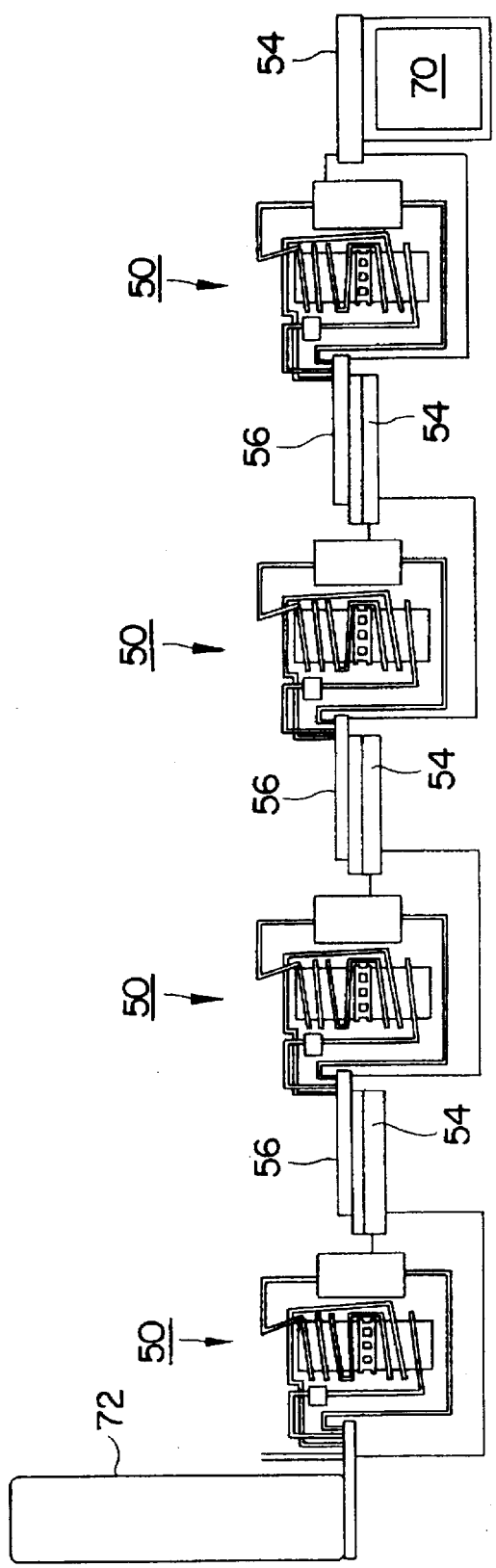
FIG. 5 shows four units of FIG. 3 ganged together.

FIG. 4 shows a thermoelectric power generator unit that can be ganged with other identical units as illustrated in FIG. 5 FIG. 4 shows a boiler 54, which receives a solution of ammonia in water gravity fed from an absorber 56 through line 52 and is heated from an outside source (outside source not shown in FIG. 4) The heated solution passes on line 57 to a separator 53 where ammonia gas escapes on line 60 to condenser 61. The condensed ammonia gas proceeds to evaporator 51 where it evaporates and mixes with hydrogen coming from absorber 56 on line 58. Water returned to the absorber 56 on line 55 from the separator 53 is heated by absorbing ammonia from the hydrogen-ammonia mix. Absorption of the ammonia also reduces the partial pressure of the ammonia in the evaporated and thereby promotes evaporation of the ammonia in the evaporator. Hydrogen separated from the ammonia gas by absorption of the ammonia by water returns to the evaporator where it ballasts the pressure throughout the system and establishes the equilibrium partial pressure of the ammonia gas.

A thermopile 68 is placed between the condenser 61 and the evaporator 59 so that the temperature gradient between the condenser 61 and evaporator 59 generates thermoelectric power in the thermopile. The amount of hydrogen in the absorber-evaporator maintains the boiling temperature of the ammonia in the evaporator at a temperature sufficiently less than the temperature of the ammonia condensing in the condenser thereby establishing the temperature gradient across the thermopile so as to drive the thermopile. The temperature in the absorber 56 is less than the temperature of the boiler 54 which is necessary in order that heat taken in by the boiler 54 at one temperature from an upper stage (not shown) is delivered to the lower stage (not shown in FIG. 4) by the absorber 6, minus heat extracted by the thermopile 8. The difference in temperature between the absorber 56 and boiler 54 also ensures that water at the lower temperature of the absorber is saturated with ammonia which is then driven off by the heat of the boiler 54.

The partial pressure of hydrogen is maintained by the volume of hydrogen maintained in the absorber-evaporator lines 28 and 15) and the gas moving device 65 (fan) which moves the ammonia-hydrogen mixture from the evaporator 59 through line 66 to the absorber 56 and thereby forces the hydrogen (stripped of ammonia by the absorber 56) passes back on line 59 back to the evaporator 51.

Summarizing the function of the thermogenerator unit of FIG. 4, heat is taken in by the boiler 54 from an "upper" stage source. The upper stage source may be the absorber of another thermoelectric generator or a "primary" source such as a motor. Part of the heat is extracted as power by the thermopile. The rest of the heat absorbed is discharged by the absorber to the boiler of the "lower" stage thermoelectric unit.

FIG. 5 shows the primary heat source 70 to be body of warm water at a temperature of 98° delivering heat to a heat sink 72 at 48° celsius through four thermoelectric units 50 of this invention.

Figure 6:
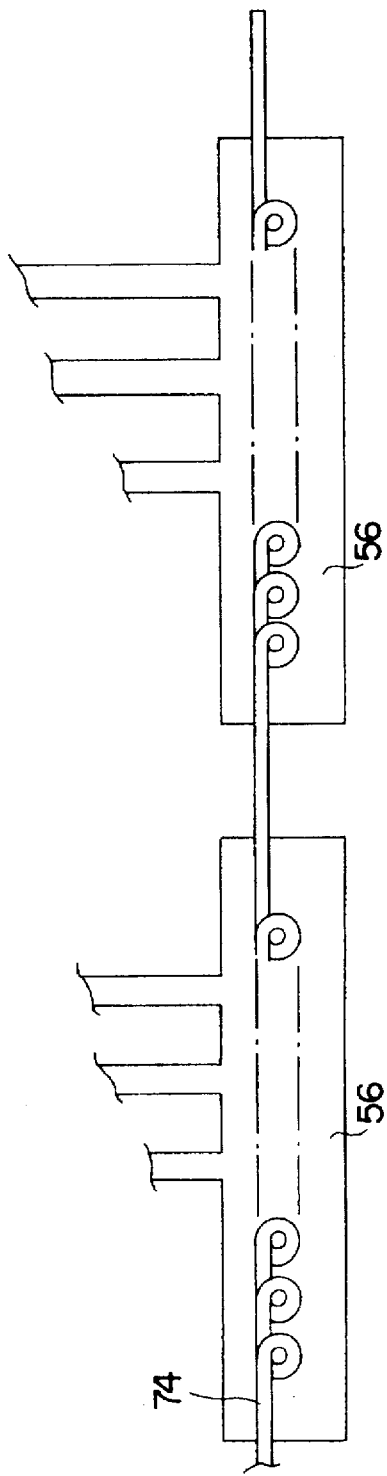
FIG. 6 shows an arrangement for ganging together more than one unit per stage.

FIG. 6 shows an arrangement in which the "boiler" of the unit 50 (cutaway) of one stage is a tube 74 passing through two absorbers 54 of a next higher stage. In this manner, each successive stage may have fewer units thereby concentrating the heat passing from stage to stage as the operating temperatures of each stage is reduced due to the production of thermoelectric power in each stage.

Variations and modifications of this invention may be suggested by reading the specification and studying the drawings which are within the scope of the invention.

For example, FIG. 1 shows a fan 23 in the hydrogen line 15 for circulating hydrogen.

Thermoelectric piles may be positioned at other locations.

Figure 7:
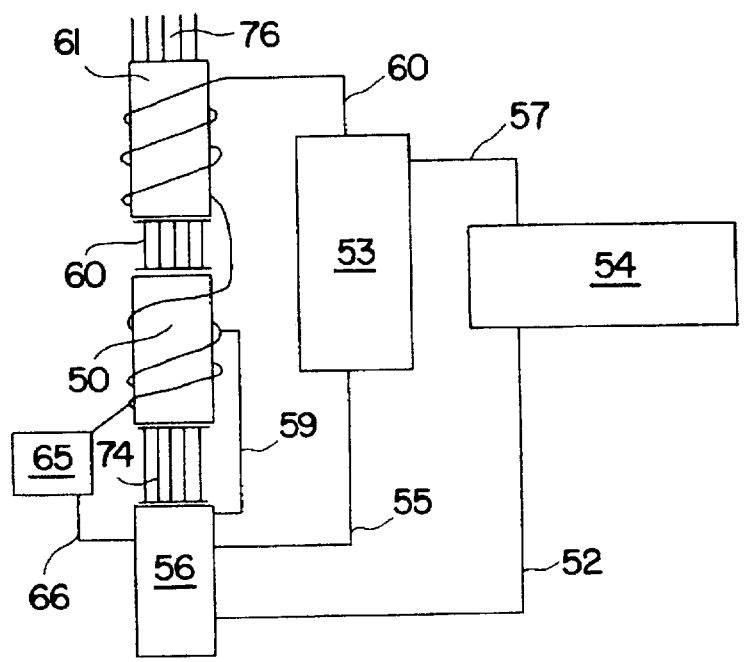
FIG. 7 shows alternate locations for positioning the thermopile within a stage.
Figure 8:
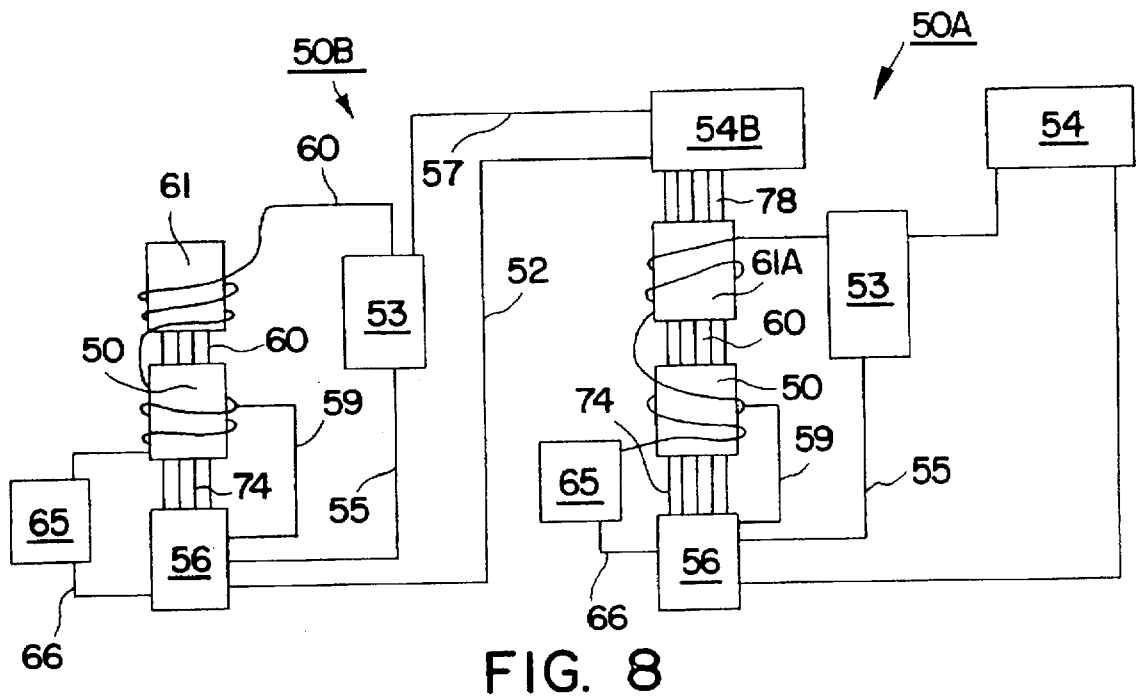
FIG. 8 shows shows alternate locations for positioning the thermopile between stages.

FIG. 7 shows a thermoelectric pile 74 having the evaporator 50 on one side and the other side on the water absorption unit 56. FIG. 7 also shows a thermoelectric pile 76 having one side communicating with the condenser 61 and second side communicating with a means of heat rejection which is shown to be the atmosphere but which could also be a cooling system. FIG. 8 shows thermopile 78 having a high side communicating with condenser 61A of stage 50A and a low side communicating with boiler 54B of stage 50B.

Figure 9:
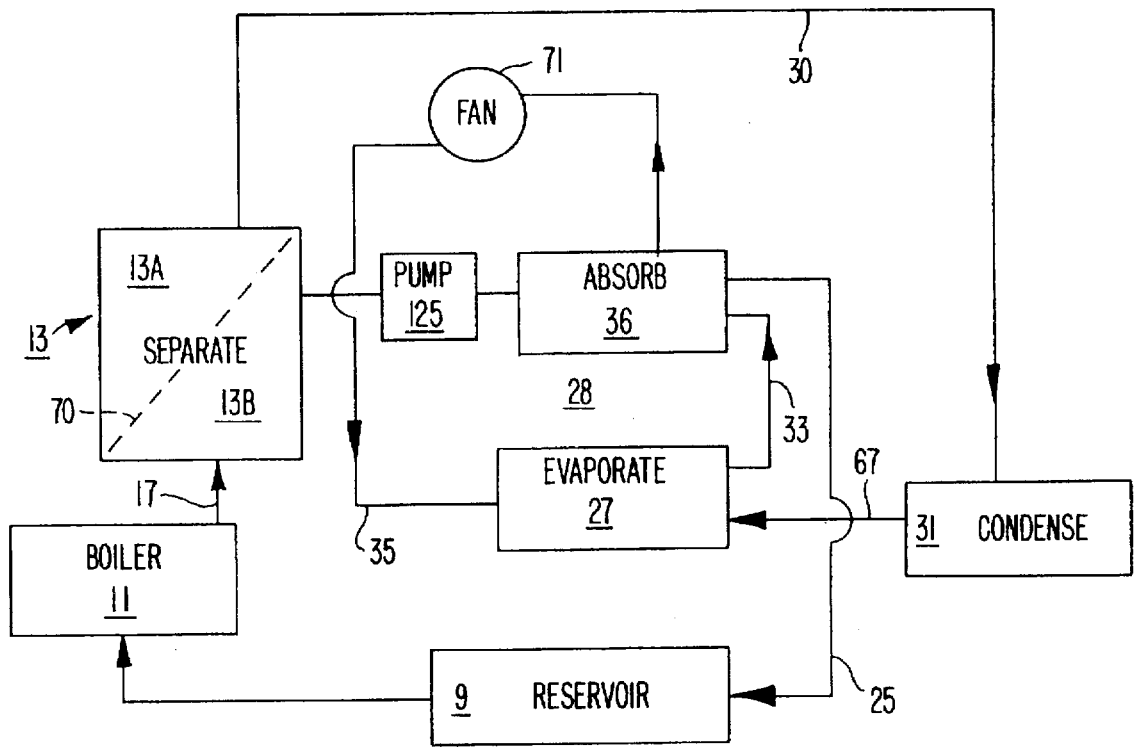
FIG. 9 shows a thermoelectric generator with a filter separator.

FIG. 9 is another embodiment of the invention wherein the features have the same identifying numbers and functions as discussed above. In addition, the separator 13 is shown having a chamber 13B separated by a filter 70 from another chamber 13A. When the ammonia dissolved in water passes from the boiler in conduit 17 into chamber 13B, the ammonia separates from the water as bubbles. The screen causes the bubbles to break up allowing the ammonia gas to pass through the screen and on out to the condenser 31. A fan 71 which aids in the circulation of hydrogen gas on line 35. FIG. 9 also shows a pump 125 inserted to circulate the solution through the boiler 11. Yet another feature is a reservoir 9 in line 25 conducting ammonia/water solution from the absorber 36 to the boiler 11 on line 25. Reservoir 9 is an aid to regulating the flow of the water solution between absorber 36 and boiler 11.

Sources of thermal energy other than combustible fuel may be used to drive the generation system. Other sources could include nuclear energy and geothermal energy.

Other components undergoing phase changes other than liquid-gas phase changes may be used to transfer heat from a heat source.

In view of such variations, I define the scope of my invention by the appended claims.

What is claimed is:

1. A system for refrigerating a region which comprises:

a burner means for generating thermal energy;

a plurality of power stages wherein each stage includes:
(i) a boiler means having a first location and adapted for absorbing heat from a source of heat at said first location;
(ii) said boiler means adapted for holding a liquid solution of a first component and a second component;
(iii) a separator means communicating with said boiler means such that when said solution is heated by said thermal energy, said liquid solution passes into said separator means where said second component is separated as a gas from said liquid first component;
(iv) an absorption means for mixing said first and second components whereby a liquid mixture of said first and second components is formed;
(v) first conductor means for conducting said first component from said separator means to said absorption means;
(vi) a condensing means for condensing said second component from a gaseous second component to a liquid second component;
(vii) a second conductor means for conducting said gaseous second component from said separator means to said condenser means whereby said gaseous second component is condensed to liquid second component;
(viii) an evaporator means communicating with said condenser means for converting said liquid second component means to gaseous second component means;
(ix) a third conduit means connecting said evaporator means and said absorption means such that said gaseous second component passes from said evaporator means to said absorption means;
(x) a fourth conduit means adapted for conducting a gaseous third component from said absorption means to said evaporator means;
(xi) means for introducing a predetermined amount of a gaseous third component into one of:
(a) said third conduit means;
(b) said fourth conduit means;
such that said predetermined amount of said third component is selected to ballast pressure in said evaporator and absorber means;
(xii) a pump means connected to said fourth conduit means adapted for pumping said gaseous third component from said absorption means to said evaporator means;

a high end stage of said plurality of stages having said respective boiler having a first location adapted to be in thermal contact with said burner means;

said burner means providing said thermal energy to said first location of said high stage;

said plurality of stages being serially connected in a succession of said stages beginning with said high end stage connected to a neighboring stage such that each stage has one of:
(i) a respective condenser;

(ii) a respective absorber;

in thermal contact respectively with said respective boiler of another neighboring stage and ending with a low end stage having a respective condenser in thermal contact with a heat sink whereby heat flows from said source of heat through said system and is discharged to said heat sink, said evaporator means of at least one of said plurality of stages having a surface adapted for absorbing heat from said region.

2. The refrigerator of claim 1 which comprises:

fifth conduit means for circulating air proximal to said condensing means;

fan means for forcing said air through said fifth conduit means such as to exhaust heat of condensation from said condenser means.

3. The thermoelectric power generator of claim 1 wherein said separator means comprises:

a container (13) having a first chamber (13B) and a second chamber (13A);

said first chamber being separated from said second chamber by a screen having multiple openings such that said gaseous second component is enabled to pass through said screen but said first component is impeded from passing through said screen;

said first chamber communicating with said boiler means;

said first conduit means being connected between said absorber means and said said first chamber means;

said second conduit means being connected between said second chamber and said condenser means;

said container adapted such that said liquid mixture of first component and second component entering said first chamber from said boiler means flows past said screen enabling bubbles of said second gaseous second component to pass through said screen into said second chamber then out to said condenser means and said liquidoud first component passes out through said first conduit to said absorber means.

4. The thermoelectric power generator of claim 1 which comprises a reservoir means connected between said absorber means and said separator for storing said liquidous first component passing from said separator means to said absorber means.

5. The thermoelectric power generator of claim 1 which comprises a pump connected between said boiler and said absorbtion means.

* * * * *